United States Patent
Natzle et al.

(10) Patent No.: US 6,858,532 B2
(45) Date of Patent: Feb. 22, 2005

(54) LOW DEFECT PRE-EMITTER AND PRE-BASE OXIDE ETCH FOR BIPOLAR TRANSISTORS AND RELATED TOOLING

(75) Inventors: Wesley C. Natzle, New Paltz, NY (US); David C. Ahlgren, Wappingers Falls, NY (US); Steven G. Barbee, Amenia, NY (US); Marc W. Cantell, Sheldon, VT (US); Basanth Jagannathan, Beacon, NY (US); Louis D. Lanzerotti, Burlington, VT (US); Seshadri Subbanna, Brewster, NY (US); Ryan W. Wuthrich, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 164 days.

(21) Appl. No.: 10/316,211

(22) Filed: Dec. 10, 2002

(65) Prior Publication Data

US 2004/0110354 A1 Jun. 10, 2004

(51) Int. Cl.$^7$ .......................................... H01L 21/4763
(52) U.S. Cl. ....................... 438/637; 438/639; 438/714; 438/309
(58) Field of Search ................................ 438/637–641, 438/708–714, 723, 309–321

(56) References Cited

U.S. PATENT DOCUMENTS

| | | | |
|---|---|---|---|
| 4,917,556 A | 4/1990 | Stark et al. | |
| 5,024,570 A | 6/1991 | Kiriseko et al. | |
| 5,076,205 A | 12/1991 | Vowles et al. | |
| 5,223,443 A | 6/1993 | Chinn et al. | |
| 5,282,925 A | 2/1994 | Jeng et al. | |
| 5,980,770 A | 11/1999 | Ramachandran et al. | |
| 6,194,286 B1 | 2/2001 | Torek | |
| 6,620,729 B1 * | 9/2003 | May ............................ | 438/638 |

FOREIGN PATENT DOCUMENTS

JP          10-36970          2/1998

* cited by examiner

*Primary Examiner*—H. Jey Tsai
(74) *Attorney, Agent, or Firm*—Graham S. Jones, II; Jay H. Anderson (57) ABSTRACT

An oxide etch process is described which may be used for emitter and base preparation in bipolar SiGe devices. The low temperature process employed produces electrical insulation between the emitter and base by a COR etch which preserves insulating TEOS glass. The insulating TEOS glass provides reduced capacitance and helps to achieve high speed. An apparatus is also described for practicing the disclosed process.

19 Claims, 8 Drawing Sheets

FIG. 1A

PRIOR ART

FIG. 2A

PRIOR ART

FIG. 1B

PRIOR ART

FIG. 2B

PRIOR ART

PRIOR ART

FIG. 3E

PRIOR ART

LOW DEFECT PRE-EMITTER AND PRE-BASE OXIDE ETCH FOR BIPOLAR TRANSISTORS AND RELATED TOOLING

BACKGROUND OF THE INVENTION

1. Field of the Invention

This invention relates to semiconductor processing, particularly to etching of dielectric materials in semiconductor devices, and more particularly to pre-emitter and pre-base etching of silicon dioxide therein.

2. Description of Related Art

U.S. Pat. No. 5,282,925 of Jeng et al. "Device and Method for Accurate Etching and Removal of Thin Film" (commonly assigned) describes a device and a method known as Chemical Oxide Removal (COR) for accurate etching and removal of a thin layer by controlling the surface residence time, thickness and composition of reactant containing film. The COR process employs etching with gaseous reactants comprising HF and $NH_3$. As the gaseous reactants contact the silicon oxide surface, a film of reaction products is formed on the silicon oxide by adsorption or condensation of the reactant gases on the silicon oxide surface at a pressure near the vapor pressure. Generally, the process of Jeng et al. etches silicon oxide from a wafer by admitting reactant vapor to a chamber which forms a film on a wafer. Etching is adjusted by controlling the film as well as chamber temperature. After etching is completed, the resulting residue can be removed by thermal desorption.

U.S. Pat. No. 5,980,770 of Ramachandran et al. for "Removal of Post-RIE Polymer on Al/Cu Metal Line" (commonly assigned) describes a COR application which removes RIE sidewall films from an aluminum line employing an etching agent comprising a gaseous or plasma mixture of HF as an etching gas and $NH_3$ as an acid neutralizing gas to remove post-RIE polymer rails on an Al/Cu metal line by chemically modifying the polymer rails into a water soluble form. It is best reacted with COR in the RIE cluster before removal into the atmosphere so that the RIE sidewall does not cause corrosion of the aluminum line. The tool cluster is a conventional RIE cluster with a unique combination of process modules.

U.S. Pat. No. 6,335,261 of Natzle, et al. for "Directional CVD Process with Optimized Etchback" describes a COR process producing a solid reaction product "believed to be ammonium hexafluorosilicate $((NH_4)_2 SiF_6)$" which has a specific volume approximately three times that of the original silicon dioxide producing a reaction at an overhang that causes a gap to be closed, so that after the gap is closed no further etching of an oxide underlying that closed gap occurs. However, etching continues at the oxide layer on the upper surface of the substrate. The solid product slows the reaction by impeding diffusion of the $NH_3$/HF reactants through the product to the underlying oxide, and as a result the etching process reaches a self-limiting point where the solid reaction product becomes too thick to permit further etching of the underlying oxide.

U.S. Pat. No. 6,194,286 B1 of Torek for "Method of Etching Thermally Grown Oxide Substantially Selectively Relative to Deposited Oxide" describes processing deposited silicon oxide (e.g. silicon oxide formed by PECVD) and outwardly exposed grown silicon oxide materials (which may be thermally grown). The outwardly exposed silicon dioxide layer is vapor etched substantially selectively to the deposited silicon dioxide layer using an etch chemistry comprising a substantially anhydrous HF (no greater than 10% water by volume) and an organic primer (e.g alcohols and ketones).

U.S. Pat. No. 5,223,443 of Chinn et al. for "Method for Determining Wafer Cleanliness" describes a method for determining the cleanliness of a semiconductor wafer comprising the steps of depositing a thin tetraethylorthosilicate (TEOS) glass film over the entire surface of a wafer and then exposing the wafer to a solution of KOH that attacks the polysilicon, but which is selective to and does not etch the TEOS glass film for the purpose of exposing pin holes during visual inspection.

In the past, integrated tools which include multi-processing, multichamber systems which transport single wafers between a series of interconnected process chambers have been provided as exemplified by U.S. Pat. Nos. 5,076,205; 4,917,556; 5,024,570; and Japanese JP1 0036970A which are discussed below.

U.S. Pat. No. 5,076,205 of Vowles et al. for "Modular Vapor Process System" shows a multichamber, multi-processing, system in which individual processing chambers are mobile to permit exchange thereof readily without requiring complete evacuation of the system. The processing capability of the system is extended by using a wafer buffer storage cassette/elevator system. The system is expanded to include a number of processing chambers permitting wafer input and output access at intermediate points.

U.S. Pat. No. 4,917,556 of Stark et al. for "Modular Wafer Transport and Processing System" describes a wafer processing machine including multiple loadlocks for loading whole cassettes into the vacuum environment. However, the wafers are transported individually. Wafer handling modules containing robot arms from a spine of the machine through which wafers are passed. Various processing modules are attached to the sides of the wafer handling modules.

U.S. Pat. No. 5,024,570 of Kiriseko et al. for "Continuous Semiconductor Substrate Processing System" describes a wafer processing system which includes a stocker coupled to the conveying mechanism to hold semiconductor wafers temporarily during the processing, but it does not transport the wafers in a vacuum. It also includes a wafer storage section for storing semiconductor wafers; a transfer mechanism for transferring semiconductor wafers between storage section and conveying mechanism; a wafer discrimination section for discriminating the semiconductor wafers; and a carrier feed-in-feed-out section capable of feeding in and feeding out semiconductor wafers.

JP10036970A of Kiyoshi for "Thin Film Vapor Growth Apparatus" provides a transfer chamber for carrying a wafer from an adjacent vacuum chamber onto a reactor (growth chamber) for growing a thin film on the wafer in the vacuum chamber. The apparatus provides for linear transport of a single wafer without even unchucking the wafer.

A number of defects are associated with stripping of silicon oxide from the surface of a workpiece such as a doped silicon semiconductor substrate with an aqueous HF solution, prior to deposition of base and emitter regions in bipolar devices, in BiCMOS integration schemes and in strained CMOS devices (for example, devices described in commonly assigned U.S. Pat. No. 6,429,061 of Rim for "Method to Fabricate a Strained Si CMOS Structure Using Selective Epitaxial Deposition of Si after Device Isolation Formation." Such defects may be caused directly by damage from exposure to the aqueous solution or indirectly by the effects from the inherent delay resulting from the changes which occur in the exposed surface of the workpiece. For example, the surface may be exposed to harmful gases in an ambient atmosphere during the time between aqueous HF treatment and a subsequent vacuum deposition process.

It is well known that an aqueous HF solution can leave a partially passivated surface on a silicon, semiconductor substrate, thus enabling a non-integrated oxide strip, but the remaining delay is a manufacturing problem, especially for the case of etching before forming the base of a transistor, i.e. a "pre-base etch". Since aqueous etches are generally batch processes, the delay is particularly severe when deposition involves a subsequent single wafer process, or if a single wafer strip precedes a batch deposition. Such a wet single wafer strip is described in U.S. Pat. No. 6,162,739 of Sumnitsch et al. assigned to SEZ Semiconductor-Equipment Zubehor fur die Halbleiterfertigung AG for a "Process for wet etching of semiconductor wafers." The process of Sumnitsch et al. '739 includes entirely removing a silicon dioxide layer from a top side and selectively removing the silicon dioxide layer from the opposite side in a defined area which extends to the inside from the peripheral edge of the semiconductor wafer, using an etching medium which includes hydrofluoric acid or a combination of hydrofluoric acid and ammonium fluoride and at least one carboxylic acid.

If a single wafer strip such as described in the '739 patent precedes a batch deposition, the delay is lengthened by the processing mismatch between a batch and single wafer operation.

A summary of some problems associated with conventional aqueous etch processing is as follows:

(A) Exposed silicon oxide located spaced away from the base or emitter regions is attacked, creating shorts between the emitter and the base or producing detrimental topography in Shallow Trench Isolation (STI) and elsewhere, so that it is difficult to provide later silicidation of overlying silicon.

(B) Isolation features between the base and the emitter can be undercut.

(C) Defects and crevices in exposed silicon, which later becomes the polysilicon gate for an accompanying CMOS device, can be penetrated by the aqueous etching solution, thereby attacking the underlying gate oxide layer.

(D) Residual silicon oxide from regrowth at the base/collector interface can produce defects during base epitaxy leading to leakage between emitter and collector; residual silicon oxide from regrowth at the base/emitter interface can contribute to higher resistance between the base and the emitter. If partial silicon oxide regrowth is followed by additional wet cleans able to remove the silicon oxide, then silicon reacted during oxide regrowth will be consumed, contributing to defects.

Further details regarding these problems are given below.

(A) Attack of Exposed Silicon Oxides (Example: Emitter Pre-Etch)

During fabrication of the new generation of SiGe BiCMOS, a critical step involves the achievement of isolation between the emitter polysilicon and the extrinsic polysilicon by means of insulators such as TetraEthylOrthoSilicate (TEOS) silicon oxide, hereinafter referred to as TEOS. The starting thickness of the TEOS is within a certain range between about 500 Å and about 1000 Å, as defined by the previous CMP processes.

There is also a stringent thermal requirement after deposition of the base, namely that in order to avoid severe dopant diffusion, any high temperature annealing for the purpose of hardening the TEOS is strictly prohibited.

Before the deposition of the emitter polysilicon, it is required that the thin HIPOX protection film (about 100 Å) on top of the base layer must be removed. There are several problems associated with the exposure of the isolation TEOS and the protection of the HIPOX (High Pressure OXide) layer at the same time during the removal of the HIPOX layer.

A HIPOX layer is kind of silicon oxide layer which is the product of a high pressure oxidation process. The HIPOX process can employ high pressure steam, high pressure oxygen, or a combination thereof to produce a silicon oxide layer. See U.S. Pat. No. 5,128,271 of Bronner et al., which indicates that the essential process sequence of the HIPOX process is described in "Low Temperature, High Pressure Steam Oxidation of Silicon," by L. E. Katz and B. F. Howells, Jr. in J. Electrochem. Soc., Vol. 126, p. 1822 (1979), which is hereby incorporated by reference. In an exemplary HIPOX process, the base is formed on a bare N-epi/N+ subcollector/P-substrate with an annealed reach-through implant. A 100 Å etch stop oxide (ESOX) is grown by HIPOX (e.g., in 10 atmospheres of steam at 700° C.), followed by formation of a P+ in-situ doped polysilicon extrinsic base and a TEOS layer. A hole is etched to the ESOX; a sidewall is then formed on the ESOX. The ESOX is then stripped with aqueous HF, and emitter polysilicon is deposited, doped and patterned. Emitter anneal (e.g., 850° C. for 20 min.), contact, and metallization steps are then performed.

Two consequences of the conventional HIPOX process are as follows:

(1) The TEOS layer covering the extrinsic polysilicon base will be completely removed, when the thin HIPOX layer for the base protection is stripped by HF during the process of forming the emitter opening. This is due to the much higher etch rate of the TEOS compared to the silicon oxide; wet HF etch removes TEOS about 10 times faster than the HIPOX.

(2) Even with a HIPOX oxidation of the extrinsic polysilicon to achieve a soft etch stop for the DHF wet strip, the thick TEOS will be mostly removed causing not only potential leakage in case there are defects in the HIPOX, but also severe increase in the parasitic capacitance. So, from the device performance point of view, maintaining a thick TEOS is highly desirable.

Furthermore, as noted above, undesirable topography is produced on STI (Shallow Trench Isolation) which results in part from the aqueous HF etch associated with a pre-base strip.

(B) Undercutting of Emitter/Base Sidewall Isolation

Figure 1A:
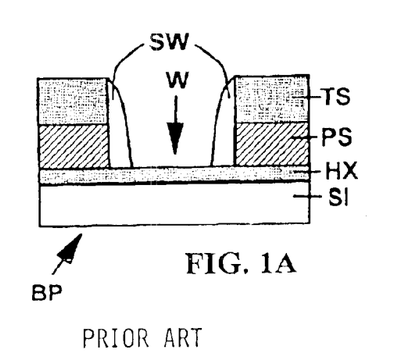
FIGS. 1A and 1B illustrate the problem of undercutting of emitter/base sidewall isolation nitride in a bipolar device.
Figure 1B:
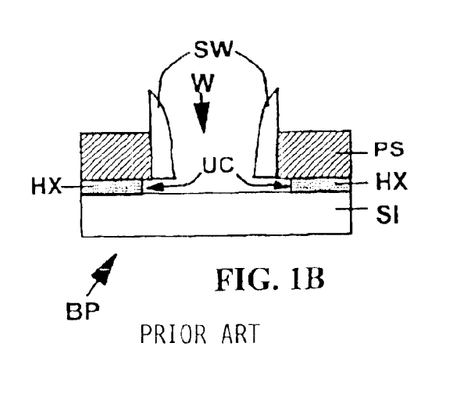

FIGS. 1A and 1B illustrate the problem of undercutting of emitter/base sidewall isolation nitride in a bipolar device BP. FIG. 1A shows bipolar device BP formed of a silicon substrate SI covered with a HIPOX layer HX, upon which a polysilicon layer PS and a TEOS layer TS are formed with a window W therethrough exposing the central portion of the HIPOX layer HX. Silicon nitride sidewall spacers SW have been formed on the sidewalls of the layers PS and TS. An aqueous solution of HF undercuts HIPOX layers in a HIPOX strip which can cause problems with the bipolar portion of a device.

FIG. 1B shows the device BP of FIG. 1A after an aqueous solution of HF has been used to strip the HIPOX layer HX at the base of the window W. One problem is that the TEOS has been etched away, i.e. completely removed as an unwanted side effect of removing the exposed portions of the HIPOX layer HX. Furthermore, an undercut UC has been formed below the sidewall spacers SW and possibly, as shown, extending under the polysilicon layer PS which is now cantilevered. The undercut UC is very problematic for process control often resulting in defect, leakage, or unwanted topography.

There is a need for an etching process which does not have the adverse side effect of undercutting below the sidewall nitride, i.e. which limits undercutting of the HIPOX layer and the like.

(C) Penetration of Defects in Polysilicon Gate Layer of CMOS Devices

Figure 2A:
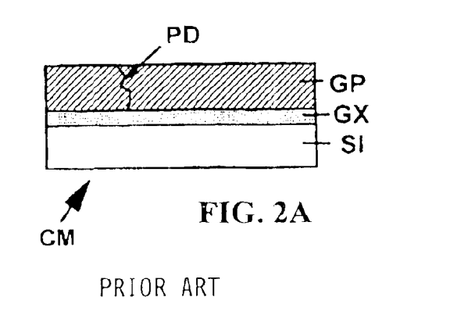
FIGS. 2A and 2B illustrate the problem of defects and crevices in an exposed gate electrode polysilicon layer of a CMOS device which can be penetrated by an aqueous etching solution thereby attacking an underlying gate oxide layer.
Figure 2B:
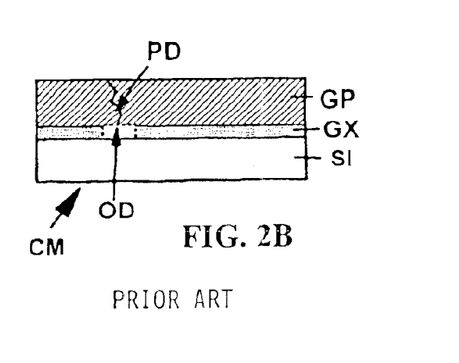

HF penetrates polysilicon during a HIPOX strip which can cause problems with the CMOS portion of a device. FIGS. 2A and 2B illustrate the problem for a CMOS device CM which comprises a silicon substrate SI on which a blanket gate oxide layer GX, has been formed, covered by a blanket layer of gate electrode polysilicon GP. In FIG. 2A a CMOS device CM is shown with a polysilicon defect PD in the polysilicon layer GP. FIG. 2B shows the device CM of FIG. 2A after treatment with an aqueous solution of HF which has penetrated through the defect in the gate polysilicon layer GP to create an oxide defect OD in the gate oxide GX.

Thus an etching process which does not have the adverse side effect of penetrating thin fissures in polysilicon layers and the like is needed.

(D) Residual Silicon Oxide

Regrowth of silicon oxide at the collector/emitter interface following a process of stripping in an aqueous HF solution causes yield loss. The manufacturing process window for atmospheric exposure is as small as 15 minutes between a silicon oxide stripping process and the growth of base epitaxy. Accordingly, there is a need for a silicon oxide etching process which can be integrated into a single tool which can also perform a process for epitaxial growth of a silicon containing layer or polycrystalline growth of a silicon layer.

FIGS. 3A–3E illustrate other aspects of the problem of using a wet chemical etch on a bipolar structure.

Figure 3A:
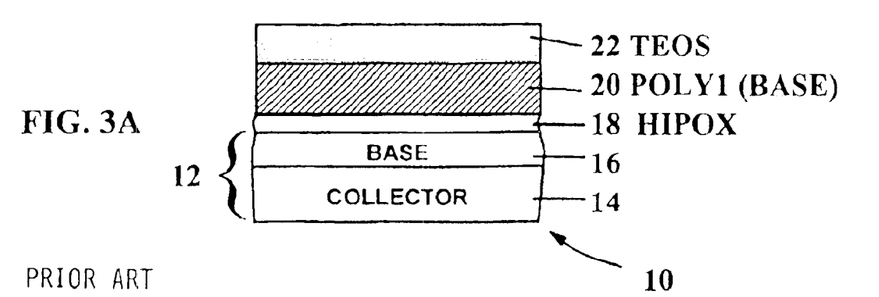
FIGS. 3A–3E illustrate other aspects of the problem of using a wet chemical etch on a bipolar structure.

FIG. 3A shows a device 10 in an early stage of manufacture. A silicon substrate 12 includes at the bottom a region comprising doped silicon collector 14. A doped silicon base 16 which comprises the intrinsic base region is formed above the silicon collector 14. A thin HIgh Pressure Oxide (HIPOX) layer 18 is formed on the surface of the substrate 12 above the intrinsic base 16. A blanket extrinsic base polysilicon layer 20 (Poly 1) is formed on top of the HIPOX layer 18. A blanket glass film in the form of a TetraEthylOrthoSilicate (TEOS) silicon dioxide layer 22 is formed on the surface of the Poly1 layer 20. The Poly1 layer 20 which is the extrinsic base is electrically connected to the intrinsic base 16 in another region (not shown) and the TEOS layer 22 is provided as electrical insulation between the Poly1 layer 20 and the emitter which is to be added, as shown in FIG. 3E.

Figure 3B:
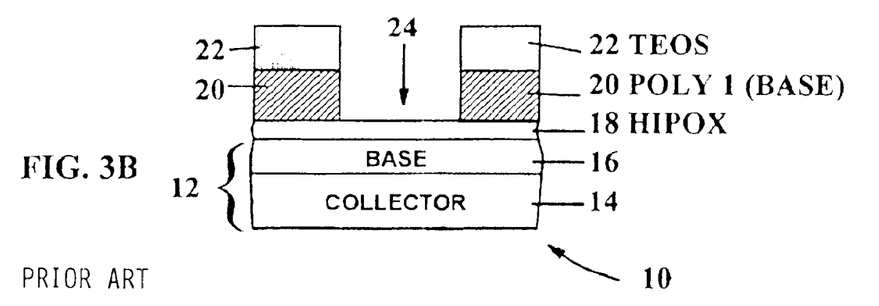

FIG. 3B shows the device 10 of FIG. 3A after formation of a window 24 through TEOS layer 22 and polysilicon layer 20 down to the top surface of the HIPOX layer 18 by photolithography and etching, as will be well understood by those skilled in the art.

Figure 3C:
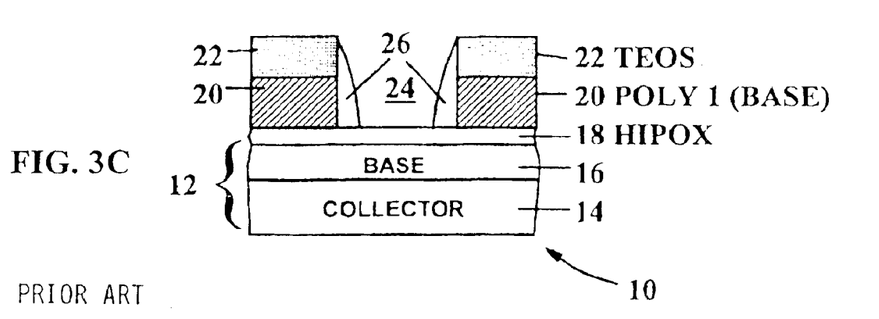

FIG. 3C shows the device 10 of FIG. 3B after formation of silicon nitride (SiN) spacers 26 from the exposed surface of the HIPOX layer 18 reaching up along the sidewalls of the TEOS layer 22 and the polysilicon layer 20 in the window 24.

Figure 3D:
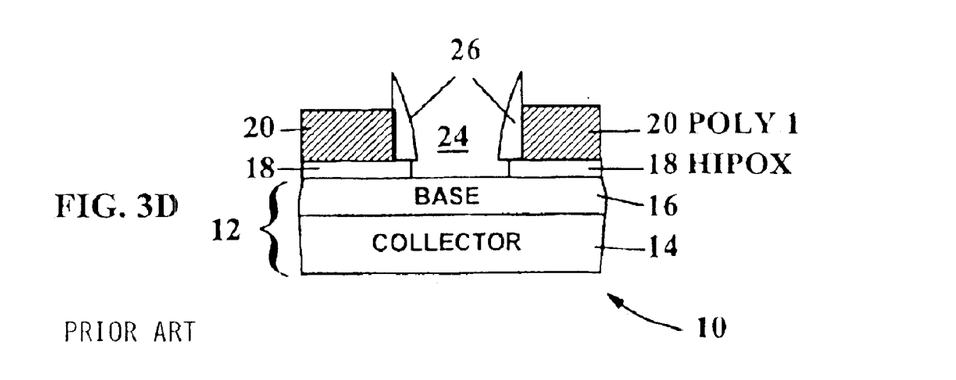
Figure 3E:
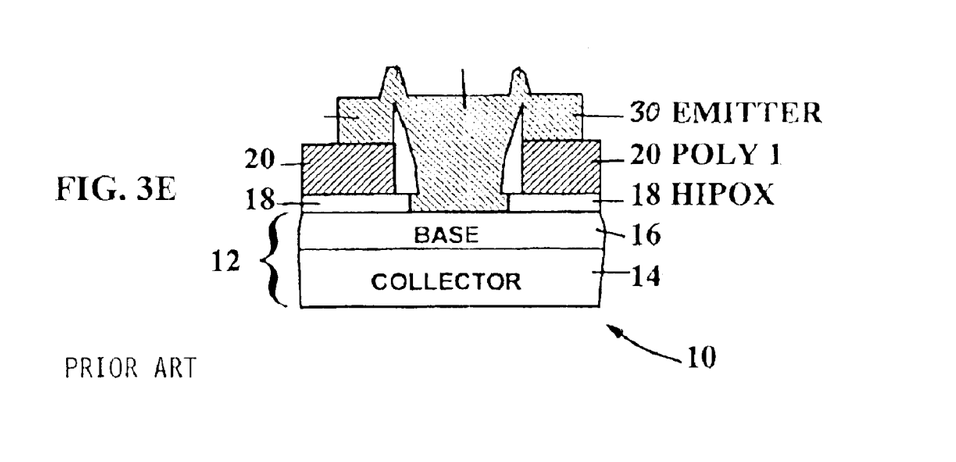

FIG. 3D shows the device 10 of FIG. 3C after wet etching with an aqueous solution of HF. In this case, the TEOS layer 22 has been etched away, i.e. completely removed, and the HIPOX layer 18 has been partially etched away below the spacers 26, leaving them less cantilevered than in FIG. 1B, but nevertheless, even this degree of undercut is unacceptable. The removal of the TEOS layer 22 is also undesirable as can be seen with reference to FIG. 3E.

FIG. 3E shows the device 10 of FIG. 3D after an emitter 30 has been formed filling the window 24, covering the spikes of the sidewall spacers 26 which were exposed by the unwanted removal of the TEOS layer 22 and reaching down to short circuit the emitter 30 to the exposed surface of the Poly1 layer 20.

There is a need for an oxide etch process which avoids unwanted attack of exposed silicon oxides, limits undercutting of sidewall isolation, and will not further damage a defective polysilicon layer. Furthermore, there is a need for an oxide etch process which can be integrated with a Si or Si/Ge growth process, so that the wafer need not be exposed to the atmosphere after the etch process.

SUMMARY OF THE INVENTION

An object of this invention is to provide an improved silicon oxide etching process for the manufacture of semiconductor devices formed of silicon oxides including HIPOX and gate oxides formed on a substrate upon which a polysilicon layer has been formed.

It is also an object of this invention is to integrate a silicon oxide etching process chamber into a tooling system which includes a chamber for subsequent silicon deposition.

In accordance with this invention a process is provided employing etching of silicon dioxide in a vacuum chamber by COR, e.g. using a mixture of HF and ammonia $NH_3$ vapor; thermal silicon oxide and silicon oxide deposited using TEOS; TEOS silicon oxide as an isolation layer in bipolar and CMOS device fabrication; and a tool with handler able to move wafers from HF and ammonia reaction, to product evaporation, to Si or Si/Ge deposition without breaking the vacuum.

A batch system is employed wherein a cassette of a plurality of wafers is moved simultaneously from a precleaning chamber to a furnace deposition chamber. SiGe layers are deposited at a low rate with a batch furnace at Ultra High Vacuum (UHV) pressures. The step of precleaning is performed in a batch precleaning chamber which is coupled to a batch furnace without the inefficiency of handling each wafer individually. This sort of tooling has not been disclosed previously, because no precleaning chamber was available which could process a batch of wafers at low enough pressures to couple to an Ultra High Vacuum (UHV) furnace.

In accordance with this invention, a device and a method are described for accurate etching and removal of thin layer by controlling the surface residence time, thickness and composition of the reactant containing film. The invention is applicable to etching using a condensed or adsorbed reactant film of HF and $NH_3$, as discussed below. An embodiment of this invention includes the following steps:

(a) forming a silicon substrate with a silicon oxide layer which further includes a structure which is damageable by an aqueous HF etch followed by atmospheric exposure;

(b) reacting the silicon oxide layer with the HF vapor and ammonia vapor to form a reaction product;

(c) removing the reaction product to expose the silicon substrate;

(d) forming a layer comprising silicon on the exposed region of the silicon substrate; and (e) further processing the substrate wherein the silicon layer is made part of a transistor or bipolar transistor.

Steps (b), (c) and (d) can be performed within a single closed COR system, e.g. a vacuum system. The damageable structure provided in step (a) can be the silicon substrate itself, a layer of silicon oxide which provides electrical isolation between transistor elements, a layer of silicon oxide underlying a masking layer such as a nitride sidewall, or a polysilicon layer which overlies a silicon oxide which, through further processing, is to become the gate dielectric of a CMOS transistor. The region of silicon substrate exposed in step (c) can be a collector or a base in a bipolar transistor. The layer comprising silicon in step (d) can be silicon or silicon/germanium.

It should be noted that commonly assigned U.S. Pat. No. 5,282,925 of Jeng et al. describes a Chemical Oxide Removal (COR) reaction, but does not describe the application of COR as a preclean for construction of SiGe bipolar transistors, the configuration of HIPOX glass to be etched while preserving TEOS glass, or describe tooling for coupling of a batch COR reaction chamber to a batch SiGe furnace which is the best tooling implementation for this application.

In addition, the tooling of the present invention may be distinguished from that described in Ramachandran et al. in that the present invention provides a combination of modules and tool structures which may be used for any sequential combination of batch processes.

BRIEF DESCRIPTION OF THE DRAWINGS

The foregoing and other aspects and advantages of this invention are explained and described below with reference to the accompanying drawings, in which.

DETAILED DESCRIPTION OF THE PREFERRED EMBODIMENTS

Vapor Phase Etching Process
(I) Process Sequence

FIGS. 4A–4I illustrate a process of vapor phase etching (i.e. using a dry etching process) in accordance with an embodiment of this invention, when manufacturing the type of bipolar structure discussed above in connection with FIGS. 3A–3E. This process overcomes the problems of complete removal of the TEOS layer 22 and undercutting of the HIPOX layer 18.

Figure 4A:
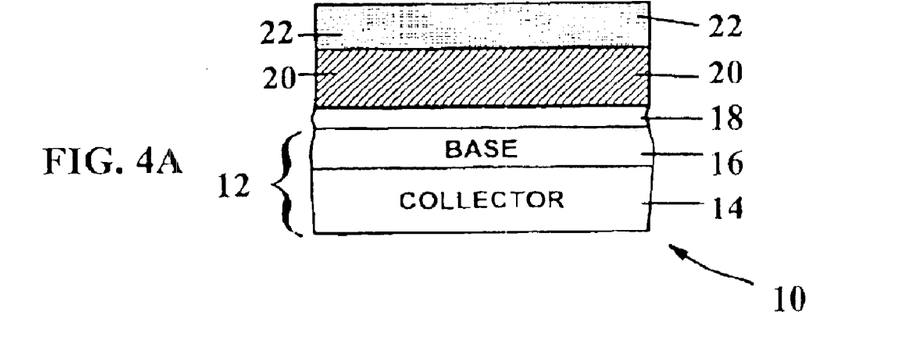
FIGS. 4A–4I illustrate a process of vapor phase etching (i.e. using a dry etching process) in accordance with an embodiment of this invention, when manufacturing the type of bipolar structure discussed above in connection with FIGS. 3A–3E.
Figure 4B:
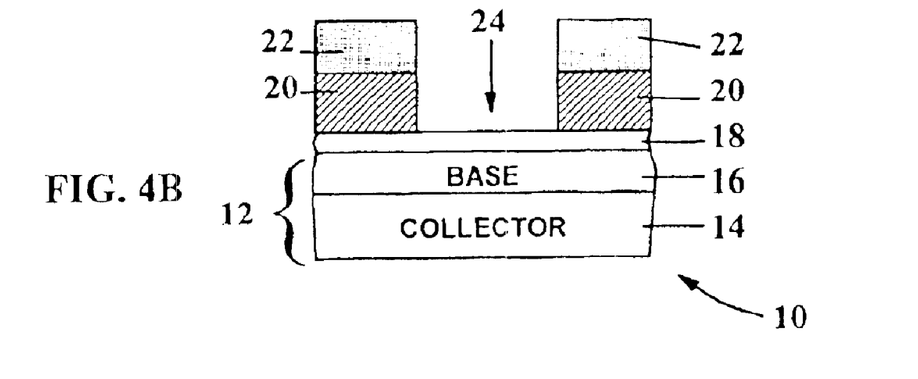
Figure 4C:
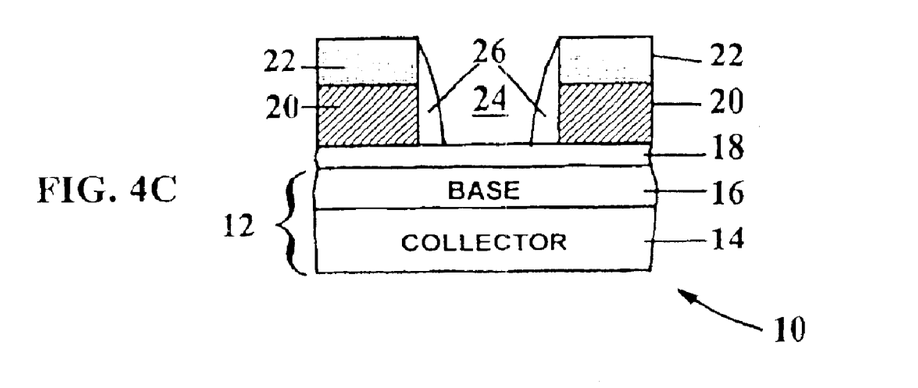

The structure formed in FIGS. 4A–4C is identical to FIGS. 3A–3C, with the same steps performed as described above, and with repeated reference numbers referring to identical elements.

Figure 4D:
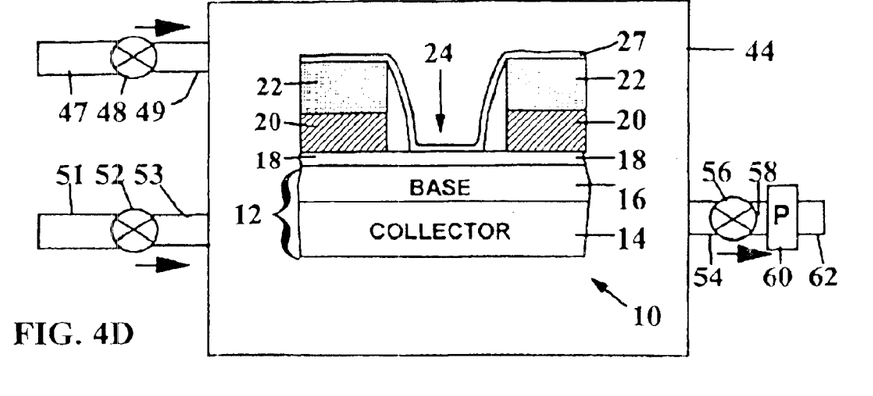

FIG. 4D illustrates the result after commencing a step of precleaning of device 10 of FIG. 1A. The precleaning starts with introduction thereof into a sealed COR reaction chamber 44 in which a Chemical Oxide Removal (COR) process uses gas phase reactants to perform a self-limiting etch that is adjustable by controlling the parameters in the COR reaction chamber 44. The COR etching process employed in the present invention comprises a vapor phase chemical oxide removal process in which a combination of the vapors of HF and $NH_3$ are employed as the etchant and carried out under low pressures (10 millitorr or below).

A first reservoir (not shown for convenience of illustration) connected to line 47 is filled with a first reactant comprising HF vapor, and a second reservoir (not shown for convenience of illustration) connected to line 51 is filled with a second reactant comprising $NH_3$ vapor. Valve 48 connects from line 47 through line 49 to an open inlet to the COR reaction chamber 44 for admission of HF vapor into chamber 44. Similarly, the valve 52 connects from line 51 through line 53 to an open inlet to the COR reaction chamber 44 for admission of $NH_3$ vapor therein. Exhaust line 54 connects through exhaust valve 56 to line 58 to the exhaust pump 60 which pumps exhaust gases to outlet line 62 for removal of gases from the COR reaction chamber 44. As shown in commonly assigned U.S. Pat. No. 5,282,925 of Jeng, Natzle and Yu for "Device and Method for Accurate Etching and Removal of Thin Film," a microbalance and a mount may be employed in the process, and the description thereof is incorporated herein by reference since those elements are not shown for convenience of illustration.

In the preferred mode of operation, the exhaust valve 56 to the vacuum pump 60 is open during admission of the first and second reactant gases into the sealed COR reaction chamber 44 after opening of valves 48 and 52. In operation, a COR adsorbed reactant film 27 is caused to deposit upon the surface of the device 10 when the valves 48 and 52 are opened. Preferably valves 48 and 52 are opened rapidly. The first and second reactants fill the COR reaction chamber 44 rapidly, and preferably the two reactants rapidly form the COR adsorbed reactant film 27 which remains on the exposed surface of the device 10 for a short period of time when the pressure of $NH_3$ and HF is above the vapor pressure at the temperature of the device 10. The blanket COR adsorbed reactant film 27 is thus formed on the exposed surfaces of the device 10, and the reaction with the exposed surface of the HIPOX layer 18 to be etched at the bottom of the window 24 is initiated.

In FIG. 4D, for purposes of illustration, the adsorbed reactant film 27 is shown, with considerable thickness. However, in fact, an amount of a few monolayers to less than a full monolayer is preferred. In addition, FIG. 4D shows the device 10 at the initiation of the reaction involved in the COR etching process.

Figure 4E:
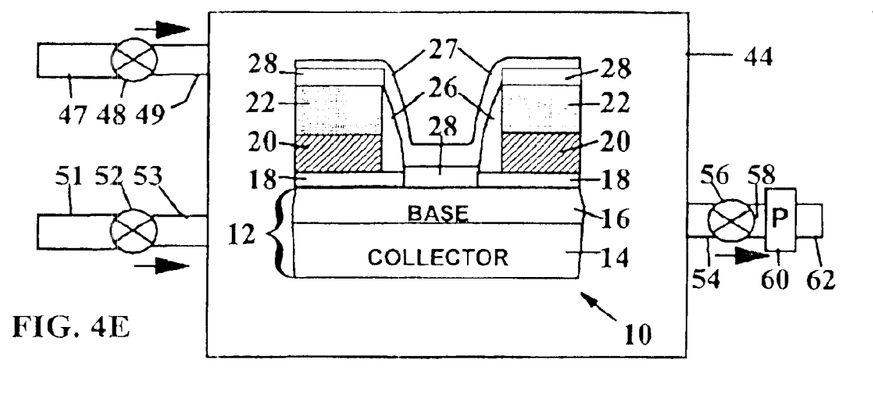
Figure 4F:
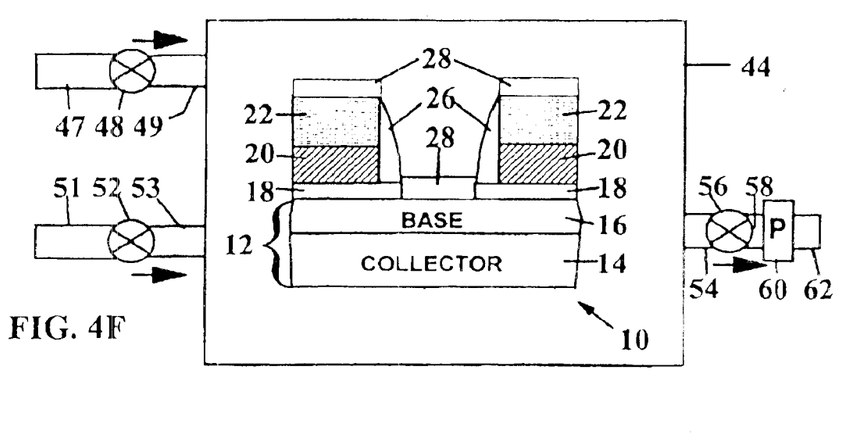

FIG. 4E shows the device of FIG. 4D after a reaction product 28 comprising ammonium hexafluorosilicate $((NH_4)_2 SiF_6)$ has formed beneath the adsorbed reactant film 27. Eventually the reaction product 28 will replace the adsorbed reactant film 27 everywhere, in a subsequent phase of the COR process of this invention as illustrated by FIG. 4F. The reaction product 28 has replaced only a portion of the TEOS layer 22, but it has replaced all of the HIPOX layer 18 immediately below the window W. At the completion of the reaction, reactant inlet valves 48 and 52 are closed eliminating the supply of reactant gases from inlet lines 49 and 53.

Since the exhaust valve 56 remains open, the adsorbed reactant film 27 eventually disappears as HF and NH$_3$ vapors are pumped out of COR reaction chamber 44, as illustrated by FIG. 4F.

Completion of the reaction and the amount of the TEOS layer 22 and the HIPOX layer 18 which are removed is a function of the substrate temperature, composition and residence time of the adsorbed reactant film 27. Factors that influence the amount removed per unit time includes vapor pressure of the reactant at the temperature of the substrate 12, the amount of reactant or the rate of reactant admitted to the sealed COR reaction chamber 44, the pumping speed of pump 60, and the reaction rate between the adsorbed reactant film 27 and the HIPOX layer 18 to be etched, all of which can be regulated by a controller as indicated in the Jeng et al. patent. We have discovered that the rate of etching in the COR reaction chamber 44 of the HIPOX layer 18 is far greater than the rate of etching of the TEOS layer 22. We believe that there is chemical and/or structural difference between the TEOS and HIPOX materials which causes the marked selectivity of the COR process to removal of HIPOX while leaving TEOS relatively intact. We have also discovered that thermal oxides including both high temperature and low temperature thermal oxides (such as HIPOX) are etched more rapidly by the COR process than the TEOS oxides which are formed by chemical decomposition which produces a material with different characteristics.

The HF and NH$_3$ reaction with the silicon dioxide of the HIPOX layer 18 is a multiple step process.

First, as illustrated in FIG. 4F, the adsorbed reactant film 27 from the HF and NH$_3$ gases has reacted with the HIPOX layer 18 and the portions of the surface of the TEOS layer 22 in contact therewith to form a condensed, solid COR reaction product 28 thereon beneath the adsorbed reactant film 27 from the reaction between the HF and NH$_3$ gases and the HIPOX layer 18 and the portions of the surface of the TEOS layer 22 in contact therewith as long as a sufficient vapor pressure of the reactant gases (HF and NH$_3$) remains in the chamber 44. The adsorbed reactant film 27 continues to reform on the surface of the COR reaction product 28 until the source of gases is depleted at which point the adsorbed reactant film 27 disappears as shown in FIG. 4F.

The result is that the HIPOX layer 18 has been removed from the base of the window W and has been replaced by the reaction product 28. As stated above the same reaction occurs with only a small fraction of the TEOS layer 22 because of the differences in COR etching rates for TEOS layer 22 and HIPOX layer 18 that we have discovered experimentally.

The reaction product 28 continues to grow in thickness as the reactant gases from the adsorbed reactant film 27 continue to pass through the reaction product 28 to react with the underlying HIPOX layers 18 and the TEOS layer 22. This reaction proceeds until after all of the base HIPOX (about 100 Å) at the bottom of the window 24 is removed; and continues until approximately the same thickness (about 100 Å) of the TEOS layer 22 is removed. Accordingly, since the TEOS layer was originally thicker than the HIPOX layer 18, a thick TEOS layer 22 remains. At the end of the process shown in FIG. 4I, it is a requirement of the semiconductor product being manufactured that a thick TEOS layer 22 remains to serve as isolation between the extrinsic base 16 and the polysilicon of the emitter 31 which is added later to assure that the emitter 31 and the extrinsic base to do not become electrically short circuited together.

Figure 4G:
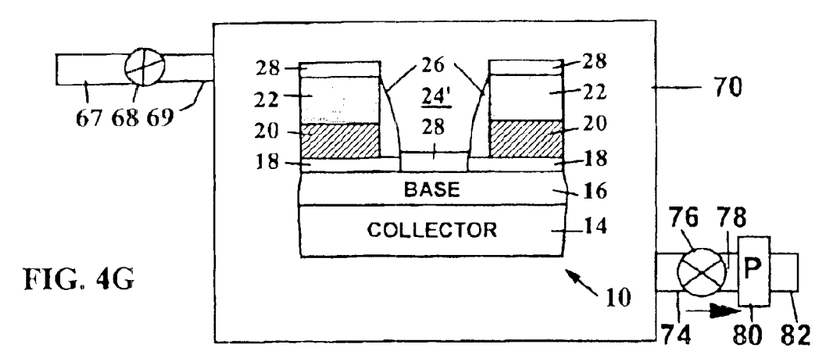

Next, referring to FIG. 4G, the device 10 of FIG. 4F is shown after transfer thereof into a heated chamber 70 that is heated to about 100° C. which includes exhaust line 74, valve 76, line 78 to pump 80 and an outlet 82. An inlet line 67, valve 68 and line 69 to chamber 70 are provided for introduction of gases into the chamber 70, but at this time the valve 68 has been turned to the closed position. The window 24" now reaches down to the top surface of the intrinsic base 16.

Figure 4H:
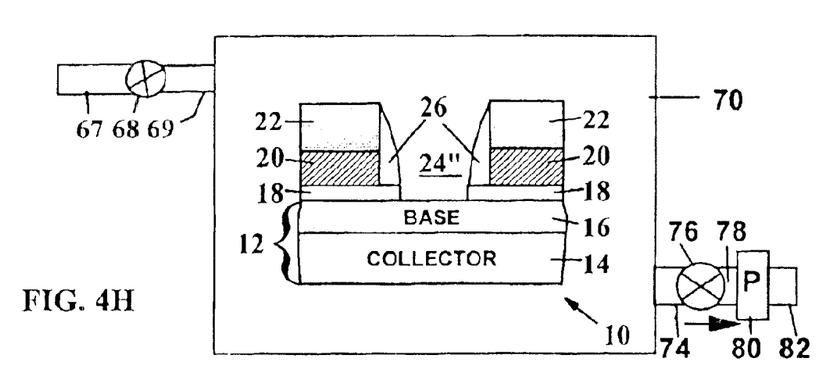

Next, as illustrated in FIG. 4H, the device 10 of FIG. 4G is shown after completion of the precleaning process by removal of reaction product 28. During heating of device 10 in chamber 70, the reaction product 28 is removed (by evaporation at about 100° C. in this case) from the top surface of the base 16 at the bottom of the window 24' and from the top surface of the TEOS layer 22.

Figure 4I:
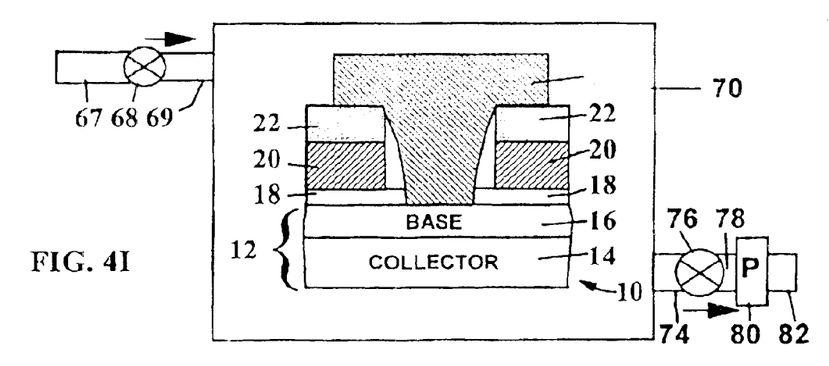

Finally, as illustrated in FIG. 4I, the device 10 of FIG. 4H is shown after the wafer temperature is raised to above the silane or dichlorosilane decomposition temperature, and valve 68 is opened to admit silane or dichlorosilane with optional dopants such as $B_2H_6$ or arsine $AsH_3$ to form a polysilicon emitter 31, shown having been formed from nucleation on the surface of the intrinsic silicon of the base 16. The deposition continues until the polysilicon emitter 31 fills the window 24" of FIG. 4H. As shown in FIG. 4I, the material of the emitter 31 is not shorted to the base layer 20, and the emitter 31 (unlike the emitter 30 in FIG. 3E) does not undercut the sidewall spacers 26.

(II) Geometric Tailoring of the HIPOX Opening

The solid COR reaction product 28 produces a self-limiting reaction, because during the interval between the results shown in FIGS. 4D and 4E the COR reaction product 28 (which as described above was formed below the adsorbed reactant film 27) impedes the diffusion of hydrogen fluoride and ammonia to the reacting surface of oxide (TEOS layer 22 and HIPOX layer 18). The self-limiting thickness of the reaction product 28 can be tuned by changing the reaction conditions. A higher pressure or lower temperature in chamber 44 increases the self-limiting thickness. Furthermore, the solid reaction product 28 occupies more volume than the silicon oxide of layers 22/18 which are being etched. This means that there is less etching at the exposed edges of the HIPOX layer 18 aside from the window 24/24'/24". Etching is terminated at those edges. The self-limiting thickness of layer 28 can be tuned by changing reaction conditions.

The length of oxide tailing, from the edge of spacer 26 into window 24, can be varied from undercut to about three times the thickness of the oxide layer 18 which is removed, with a maximum thickness of thermal oxide removal of about 250 Å in a single etching step.

(III) Other Features of the Process

The combination of deposition and the COR etching processes of the present invention offers the advantage of tailoring the interaction between the processes. For example, the interaction between deposition conditions produces a surface of a given configuration provided by COR etch conditions clears away the HIPOX oxide 18 from the surface of the substrate 12. As a result, a silicon oxide profile is produced in which the base 16 and the emitter 28 meet with the TEOS providing insulation between the extrinsic base 20 and the emitter 28, thereby providing the desired configuration.

In particular, the Chemical Oxide Removal (COR) process is highly selective and self-terminating, thereby enabling controlled removal of thin layers of silicon oxide such as the HIPOX layer 18 to the degree desired and avoiding unintended undercutting by lateral removal of HIPOX 18. By contrast, wet etching processes, do not offer the combination of self-termination and high selectivity and thus fail to offer an opportunity for tailoring the interaction between the deposition and the etching processes.

The mixture of reactive gases comprising HF from line 49 and $NH_3$ from line 53 initially forms the adsorbed reactant film 27 on the surface of the silicon oxide HIPOX layer 18. Preferably, that mixture of reactive gases comprises a combination of HF (hydrogen fluoride) gas introduced through line 47, valve 48 and line 49 into chamber 44 and ammonia ($NH_3$) gas introduced through line 51, valve 52 and line 53 into the chamber 44 to remove the conformal HIPOX silicon oxide layer 18 exposing the surface of the crystalline silicon substrate 12 at the base of the window 24" as seen in FIG. 4H.

Although the chemical reactions discussed herein are designed to remove silicon dioxide from silicon, other combinations of sources of chemical materials and other chemical steps can be employed. For instance, a number of different chemistries commonly used with aqueous solutions can be employed in the devices of the present invention designed for accurate etching.

Some of the specific sources include the gaseous vapor from solid ammonium bifluoride; a solution of HF, $NH_3$, and $H_2O$; separate sources of HF, $NH_3$, and $H_2O$; separate sources of HF and $NH_3$; a solution of $NH_3/H_2O$ coupled with a gaseous or solution source of HF, and the like. In addition, HF and ammonia can be generated in a plasma from precursor gases. Solvents or solutions other than water can be used, e.g. alcohol can replace water. For another example, the silicon dioxide which forms on many silicides can react with condensed layers containing HF. Oxides other than silicon dioxide react with condensed layers containing HF and $NH_3$ or $H_2O$. An example of that is that experiments have shown that HF vapor chemistries, including the vapor from ammonium bifluoride solid, remove oxides which incorporate germanium. Even pure germanium oxide will react.

There are a several low pressure or high temperature chemistries which use a source of a solid containing ammonium ions or separate sources containing ammonia and an acid. Ammonia is unique in that ammonia has a high vapor pressure while the ammonium ion containing solid which forms upon reaction with an acid is not particularly volatile. Thus, a number of aqueous chemistries which etch films besides oxides show analogous reactions in condensed films containing ammonia. When etching material, it is not necessary to etch a large amount of the material. For instance, removal of trace metal contamination may be achieved by the method of this invention.

Since high temperature annealing is not allowed after the base deposition in the bipolar fabrication, this vapor phase etch is well suited to preclean a silicon containing layer prior to silicon deposition, when a thick TEOS isolation layer is exposed. As a comparison, when wet etch is used, the removal of the TEOS is about 1000 Å if 100 Å HIPOX is to be removed, according to 10:1 ratio for annealed TEOS compared to HIPOX. There will not be enough TEOS left for isolation. The TEOS layer is damaged by the wet etch, resulting in shorting of the emitter to the base.

In alternative embodiments the pre-base cleaning process is similar to the above, except the transistor region is defined by exposed silicon between Shallow Trench Isolation (STI) regions. The STI regions can be damaged by the wet HF etch to produce the large divots. We have found that SiGe epitaxy can be successfully grown on the HF/ammonia cleaned surface. No defects are observed, and oxygen levels meet device requirements.

(IV) Solution of Exposed Oxide Attack Problem

Problem (A), as described above, is characterized by attack of exposed silicon oxide away from the base or emitter regions, creating shorts between emitter and base or producing detrimental topography in STI and elsewhere so that later silicidation of overlying silicon is difficult. This problem is effectively addressed by the use of an HF/ammonia vapor phase etch, since thermal silicon oxides have higher reaction rates in an HF/ammonia vapor phase etch than TEOS, or other types of silicon oxide (in contrast to the aqueous HF etch, where TEOS etches at a higher rate than thermal oxide). Accordingly, a thick TEOS isolation formed after a pre-emitter clean can be obtained by using a vapor phase etching of the base HIPOX, preventing the total removal of the isolation TEOS. An important advantage of this vapor phase etch is that no high temperature anneal is needed to harden the TEOS, avoiding any base degradation due to the dopant thermal diffusion. Similarly, there is equivalent or less attack of STI silicon oxides in a pre-base clean when compared with aqueous HF etches.

(V) Solution of Undercut Problem

The problem of undercutting of isolation features between base and emitter (problem (B) above) is solved because the HF and ammonia reaction with silicon dioxide creates a solid reaction product which expands in volume. The solid reaction product limits undercutting, because it serves as a diffusion barrier to the reacting HF and ammonia. The oxide structure underneath the nitride sidewall spacers is not damaged as in the aqueous etch process. In particular, the corner profile of the HIPOX after the vapor phase etch can be controlled with a tail-shaped structure, or a nearly vertical profile according to the amount of overetch, so that undercut is completely prevented. The prevention of the undercut by the vapor phase etch is extremely important in several modules such as the thermal silicon oxide removal before the base deposition. The undercut has also been linked to such problems as defects, leakage and unwanted topography.

Furthermore, a combination of polysilicon HIPOX and vapor phase etch will provide still better isolation, by preventing any potential leakage due to pipes generated in the TEOS, and at the same time ensure thick enough TEOS for isolation and reduction of capacitance.

(VI) Solution of Etch Penetration Problem

As stated above with regard to problem (C), with reference to FIGS. 2A and 2B, the problem is that defects and crevices in exposed silicon which later becomes the polysilicon gate for the accompanying CMOS can be penetrated by the aqueous etch thus attacking underlying gate oxide. In the preferred embodiment of the present invention, problem (C) is solved because the HF and ammonia reaction with silicon dioxide creates a solid reaction product which expands in volume and plugs any silicon oxide lined crevice. The advantage afforded by ths invention of plugging of crevices contrasts with an aqueous etch which dissolves any silicon oxide and readily penetrates any crevice.

(VII) Solution of Residual Oxide Problem

Residual silicon oxide from regrowth at the base/collector interface can produce defects during base epitaxy leading to leakage between an emitter and a collector (problem (D) described above). If a second aqueous treatment is used to remove the regrown silicon oxide, the problem is that silicon can also be removed leading to defects from roughness. These problems are avoided in the present invention, since the vapor phase oxide etch is integrated with the subsequent Si (or Si/Ge) growth process, so that the precleaning and growth processes are performed in a single vacuum system, thereby avoiding exposure to atmosphere and regrowth of native oxide. Because of the surprisingly large impact of silicon oxide regrowth in pre-base silicon oxide cleans, it is important to be able to integrate a silicon oxide removal chamber with the silicon or silicon/germanium growth chamber. The HF and ammonia reaction with silicon dioxide can take place at a low pressure (below 10 mTorr). It can be readily integrated with a silicon/SiGe growth chamber, in contrast to an aqueous clean or conventional vapor HF cleaning steps which generally take place at atmospheric pressure, or at pressures of at least several Torr.

Apparatus for Performing Integrated Etch/Evaporation/Deposition Processes

Figure 5:
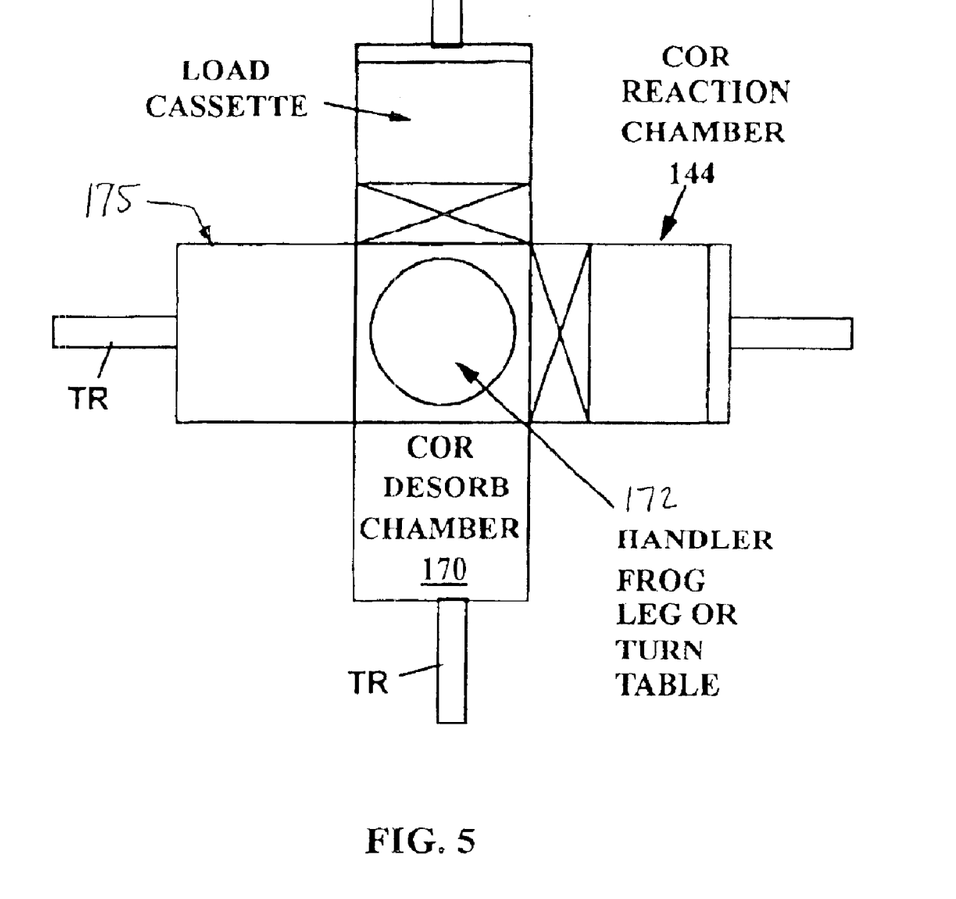
FIG. 5. shows a tool in accordance with this invention with a handler able to move wafers from the HF and ammonia reaction, to product evaporation, to Si or Si/Ge deposition without breaking vacuum.
Figures 6A, 6B:
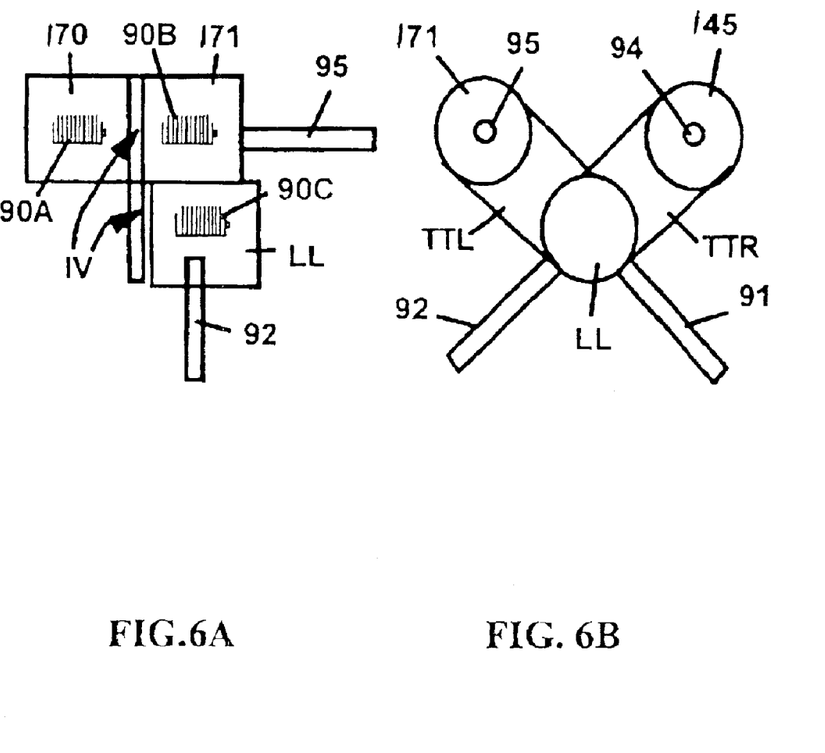
FIGS. 6A–6C show another tool in accordance with this invention with a handler able to move wafers from the HF and ammonia reaction, to product evaporation, to Si or Si/Ge deposition without breaking vacuum.
Figure 6C:
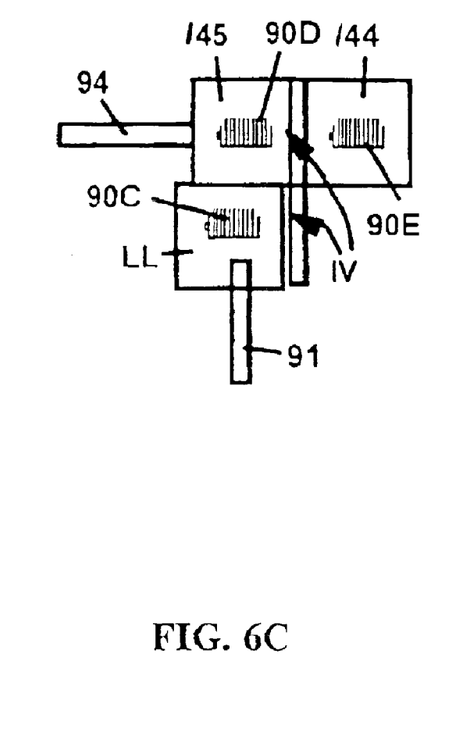

FIG. 5. and FIGS. 6A–6C show tools with a handler able to move wafers from the HF and ammonia reaction, to product evaporation, to Si or Si/Ge deposition without breaking vacuum. The tool can combine product evaporation and Si or SiGe deposition chambers, and it can be of the single wafer or batch type. An important feature of the batch multichamber tool is a transportable cassette (of material compatible with both oxide etch and silicon deposition) which can be shuttled between chambers.

FIG. 5 is a diagram for a batch process apparatus, wherein a boat of wafers is shuttled between process chambers. For the SiGe applications, the wafers are reacted in the COR (HF and ammonia) reaction chamber 144, then shuttled into chamber 170 for evaporation of the COR reaction product, then finally into the silicon/SiGe deposition chamber 175. Transport rods TR are provided for pushing the cassette from chambers to a handler frog or turntable in central chamber 172. Alternatively, chambers 170 and 175 may be one and the same chamber.

FIGS. 6A–6C show an embodiment which uses a SiGe epitaxy system to process wafers in accordance with this invention. FIG. 6A shows a left elevation of the tool; FIG. 6B shows a front elevation and FIG. 6C shows a right elevation. While a horizontal orientation is shown, a vertical orientation is also possible.

FIG. 6B shows the load lock LL which is connected to the transport chamber which includes a left tube TTL reaching up to left transport chamber 171 and right tube TTR which reaches up to right transport chamber 145. The left transport chamber 171 is connected to COR desorb chamber 170 which can be seen in the left elevation of FIG. 6A. Isolation valves IV isolate the various chambers so that shuttling can occur when a reaction is taking place in a reaction chamber, in the case of operation with multiple boats.

A wafer boat 90 (shown in five exemplary boat positions 90A–90E) holds a batch of multiple wafers. The boat 90 is shuttled from load lock LL through the transport tubes TTL and TTR to transport chambers 171 and 145 by transport rods 91 or 92. Then transport rods 94 or 95 respectively pick up the boat and shuttle the boat into the COR desorb chamber 170 or into the COR reaction chamber 144. Chamber 170 may also be a SiGe or Si furnace.

The boat is shown in some of the different positions to which a boat may be transported from an atmospheric load lock LL to a central transport chamber with left tube TTL and right tube TTR, from which the boats are distributed to other attached process chambers.

The boat is transported laterally or diagonally in a transport chamber, then inserted into other chambers at right angles to the plane or line of movement inside the transport chamber. Insertion can be on one side or on both sides of the plane (and perpendicular to the plane) formed by movement of the wafer boat in the transport chamber. When insertion is on both sides, there will be process chambers on both sides of the transport chamber. The left side view in FIG. 6A shows the process chamber 170 only on the left side of the transport chamber. Transport rods can draw the boat into the chamber or can be on the opposite side of the transport chamber from the process chamber and can be pushed into the process chamber. Lift pins are incorporated as appropriate.

Some additional embodiments of the above-described apparatus are as follows. The transport chambers 171/145 may also include an atmospheric load lock. Alternatively, an atmospheric load lock may be provided on an end of each transport chamber (coplanar or collinear with the motion of the wafers in the transport chamber).

The central chamber 172 may include a rotary table which is a vertically moveable, with lift pins as appropriate; the rotary table may have indentations or recesses therein to facilitate handler access and/or grabbing and lifting the of the wafer boats. The wafers may be placed in the center of the rotary table, or off center so that more than one boat can occupy the rotary table simultaneously.

When the apparatus includes a central chamber, a transport rod may be mounted on the process chamber opposite the central chamber to draw the boat into the process chamber. Alternatively, a transport rod may be mounted on the central chamber opposite the process chamber, so that the wafers are pushed into the process chamber. In this case process chambers cannot be directly opposite each other.

Each type of transport can be fitted with a chamber as described in U.S. Pat. No. 5,636,320, or with a separate chamber for reaction and a separate chamber for elimination of the reaction product by evaporation or thermal desorption.

Each type of transport can be fitted with one or more chambers equipped to expose wafers to a mixture of HF and ammonia which is coupled, through the transport chamber, to one or more chambers equipped to remove, from the surface of the wafers, the products of the HF and ammonia reaction with silicon dioxide.

Other process chambers may be attached to the above-described tool to provide further process integration. Such chambers may include chambers for polysilicon deposition, advanced gate dielectric deposition, or conductor/contact liner CVD. In particular, one or more tube furnaces may be attached to the tool. The wafer boat orientation may be perpendicular or parallel to the transport direction. The plane of the wafers can be either perpendicular or parallel to the ground.

It should be noted that the temperature requirements for various stages of the above-described vapor phase etch process are different. The HF/ammonia reaction with oxide requires a stable chamber temperature near room temperature. Evaporation of the reaction product generally requires a chamber temperature near 100° C., so that the reaction product does not recondense on the chamber walls after it is evaporated from the wafers. Performing reaction and evaporation in separate chambers eliminates the extra time required for cooling the chamber after evaporation. In particular, there is a benefit when the HF/ammonia vapor phase etch tool is combined with a hot process furnace; the hot process furnace can then be used for evaporation of the reaction product.

While this invention has been described in terms of the above specific embodiments, those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

We claim:

1. A process comprising the steps as follows:

forming an opening through a TetraEthylOrthoSilicate (TEOS) glass layer and an intermediate layer therebelow with the opening extending down to an exposed surface of a silicon containing material and with the opening exposing sidewalls of the opening including sidewalls of the TEOS glass layer and the intermediate layer, forming sidewall spacers on the sidewalls of the opening covering the sidewalls of the TEOS glass layer and the intermediate layer, and selectively etching of the silicon containing material by Chemical Oxide Removal (COR) process leaving the TEOS layer remaining in place protecting the intermediate layer.

2. The process of claim 1 wherein the silicon containing material is comprises a High PRressure Oxide (HIPOX) material.

3. The process of claim 1 wherein during the step of selectively etching a portion of the TEOS layer is converted into a solid reaction product and an exposed portion of the silicon containing material is converted into a solid reaction product.

4. The process of claim 1 wherein the step of selectively etching includes the steps as follows:

forming a blanket adsorbed reactant film of HF and $NH_3$ over exposed surfaces including those of the TEOS layer an the silicon containing material, and then converting a portion of the TEOS layer into a solid reaction product wherein a portion of the TEOS layer and an exposed portion of the silicon containing material are converted into a solid reaction product.

5. The process of claim 3 wherein the etching process comprises:

admitting COR gases to form an adsorbed reactant film of HF and $NH_3$ on exposed surfaces of the silicon containing material, sidewall spacers and the TEOS layer, forming the solid reaction product beneath the adsorbed reactant film, terminating the admission of COR gases into the vacuum chamber, and heating to remove the solid reaction product from the vacuum chamber.

6. The process of claim 1 wherein the step of selectively etching of the silicon containing material is performed in a sealed reaction chamber.

7. The process of claim 1 wherein the COR process employs a mixture of HF and ammonia $NH_3$ vapor.

8. The process of claim 1 wherein the etching process comprises:

performing the step of forming solid reaction product beneath the adsorbed reactant film in a sealed reaction chamber at a low pressure of about 10 milliTorr or below by admitting COR reactant gases into the sealed reaction chamber by opening valves from sources of COR reaction gases, terminating the admission of COR gases into the sealed reaction chamber by closing the valves from the sources of COR reaction gases, and heating to remove the solid reaction product from the sealed reaction chamber.

9. The process of claim 8 wherein the COR process employs a mixture of HF and ammonia $NH_3$ vapor.

10. The process of claim 8 wherein an emitter is formed in the opening after removal of the reaction product the step is performed of introducing an emitter forming gas selected from the group consisting of silane and dichlorosilane into a chamber containing the workpiece heated above the decomposition temperature of the emitter forming gas.

11. A process comprising the steps as follows:

forming an opening through a first silicon oxide material and an intermediate layer therebelow with the opening extending down to an exposed surface of a second silicon oxide material, and with the opening exposing sidewalls of the opening including sidewalls of the first silicon oxide material and the intermediate layer, forming sidewall spacers on the sidewalls of the opening covering the sidewalls of the first silicon oxide layer and the intermediate layer, and selectively etching of the second silicon oxide material by a Chemical Oxide Removal (COR) process leaving the first silicon oxide layer remaining in place protecting the intermediate layer.

12. The process of claim 11 wherein the second silicon containing material comprises a High PRressure Oxide (HIPOX) material.

13. The process of claim 11 wherein during the step of selectively etching a portion of the TEOS layer is converted into a solid reaction product and an exposed portion of the silicon containing material is converted into a solid reaction product.

14. The process of claim 11 wherein the step of selectively etching includes the steps as follows:

forming a blanket adsorbed reactant film of HF and $NH_3$ over exposed surfaces including those of the TEOS layer an the silicon containing material, and then converting a portion of the TEOS layer into a solid reaction product wherein a portion of the TEOS layer and an exposed portion of the silicon containing material are converted into a solid reaction product.

15. The process of claim 13 wherein the etching process comprises:

admitting COR gases to form an adsorbed reactant film of HF and $NH_3$ on exposed surfaces of the silicon containing material, sidewall spacers and the TEOS layer, forming the solid reaction product beneath the adsorbed reactant film, terminating the admission of COR gases into the vacuum chamber, and heating to remove the solid reaction product from the vacuum chamber.

16. The process of claim 11 wherein the step of selectively etching of the silicon containing material is performed in a sealed reaction chamber.

17. The process of claim 11 wherein the COR process employs a mixture of HF and ammonia $NH_3$ vapor.

18. The process of claim 16 wherein the etching process comprises:

performing the step of forming solid reaction product beneath the adsorbed reactant film in a COR reaction chamber at a low pressure of about 10 milliTorr or below by admitting COR reactant gases to the COR reaction chamber by opening valves from sources of COR reaction gases, terminating the admission of COR gases into the vacuum chamber by closing the valves from the sources of COR reaction gases, and heating to remove the solid reaction product from the vacuum chamber.

19. The process of claim 18 wherein the COR process employs a mixture of HF and ammonia $NH_3$ vapor.

* * * * *